United States Patent
Jiang et al.

(10) Patent No.: US 9,401,437 B2
(45) Date of Patent: Jul. 26, 2016

(54) PARTIALLY-SPRAYED LAYER ORGANIC SOLAR PHOTOVOLTAIC CELL USING A SELF-ASSEMBLED MONOLAYER AND METHOD OF MANUFACTURE

(71) Applicants: Xiaomei Jane Jiang, Tampa, FL (US); Jason Erik Lewis, Lutz, FL (US)

(72) Inventors: Xiaomei Jane Jiang, Tampa, FL (US); Jason Erik Lewis, Lutz, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 13/907,397

(22) Filed: May 31, 2013

(65) Prior Publication Data

US 2013/0284242 A1    Oct. 31, 2013

Related U.S. Application Data

(63) Continuation of application No. PCT/US2012/023491, filed on Feb. 1, 2012.

(60) Provisional application No. 61/438,488, filed on Feb. 1, 2011.

(51) Int. Cl.
| | |
|---|---|
| *H01L 31/00* | (2006.01) |
| *H01L 31/02* | (2006.01) |
| *H01L 51/00* | (2006.01) |
| *H01L 31/042* | (2014.01) |

(Continued)

(52) U.S. Cl.
CPC .............. *H01L 31/02* (2013.01); *H01L 31/042* (2013.01); *H01L 51/0003* (2013.01); *H01L 51/442* (2013.01); *H01L 51/0036* (2013.01); *H01L 51/0037* (2013.01); *H01L 51/4253* (2013.01); *Y02E 10/549* (2013.01); *Y02P 70/521* (2015.11)

(58) Field of Classification Search
None
See application file for complete search history.

(56) References Cited

U.S. PATENT DOCUMENTS

| | | | |
|---|---|---|---|
| 4,035,197 A | * | 7/1977 | Raychaudhuri ............... 136/255 |
| 4,511,600 A | | 4/1985 | Leas |
| 6,054,809 A | * | 4/2000 | Haynes et al. ................ 313/505 |

(Continued)

FOREIGN PATENT DOCUMENTS

| | | | |
|---|---|---|---|
| WO | WO 2010010838 A1 | * | 1/2010 |
| WO | 2012044971 A2 | | 4/2012 |

OTHER PUBLICATIONS

Hau et al., Organic Electronics, 10 (2009), 719-723.*

(Continued)

*Primary Examiner* — Eli Mekhlin
(74) *Attorney, Agent, or Firm* — Molly L. Sauter; Robert J. Varkonyi; Smith & Hopen, P.A.

(57) ABSTRACT

The fabrication and characterization of large scale inverted organic solar array fabricated using all-spray process is disclosed. Solar illumination has been demonstrated to improve transparent solar photovoltaic devices. The technology using SAM has potential to revolute current silicon-based photovoltaic technology by providing a complete solution processable manufacturing process. The semi-transparent property of the solar module allows for applications on windows and windshields. The inventive modules are more efficient than silicon solar cells in artificial light environments. This significantly expands their use in indoor applications. Additionally, these modules can be integrated into soft fabric substances such as tents, military back-packs or combat uniforms, providing a highly portable renewable power supply for deployed military forces.

9 Claims, 5 Drawing Sheets

(51) Int. Cl.
*H01L 51/44* (2006.01)
*H01L 51/42* (2006.01)

(56) References Cited

U.S. PATENT DOCUMENTS

| | | | |
|---|---|---|---|
| 2003/0108725 A1* | 6/2003 | Hamilton et al. | 428/195.1 |
| 2004/0187917 A1* | 9/2004 | Pichler | 136/263 |
| 2006/0207646 A1 | 9/2006 | Terreau et al. | |
| 2007/0017567 A1 | 1/2007 | Gronet et al. | |
| 2008/0149178 A1* | 6/2008 | Reyes-Reyes et al. | 136/263 |
| 2009/0038683 A1* | 2/2009 | Walter et al. | 136/263 |
| 2009/0155459 A1 | 6/2009 | Park et al. | |
| 2009/0188558 A1 | 7/2009 | Jen et al. | |
| 2009/0229667 A1 | 9/2009 | Shrotriya et al. | |
| 2009/0255583 A1 | 10/2009 | Young et al. | |
| 2009/0301544 A1* | 12/2009 | Minelli | 136/244 |
| 2009/0301556 A1 | 12/2009 | Kawano et al. | |
| 2010/0072462 A1* | 3/2010 | Brown et al. | 257/40 |
| 2010/0300536 A1* | 12/2010 | Aitken et al. | 136/260 |
| 2010/0307589 A1 | 12/2010 | Choi et al. | |
| 2010/0308307 A1 | 12/2010 | Meerholz et al. | |
| 2011/0015427 A1 | 1/2011 | Hummelen et al. | |
| 2011/0018424 A1* | 1/2011 | Takada | 313/352 |
| 2011/0186112 A1* | 8/2011 | Aernouts et al. | 136/249 |

OTHER PUBLICATIONS

Boland et al., Thin Solid Films, 518, (2010), 1728-1731.*
Unknown, Delta Technologies Limited Product Guide, arched to Apr. 27, 2009.*
A. Yakimov and S. R. Forrest, High photovoltage multiple-heterojunction organic solar cells incorporating interfacial metallic nanoclusters. Appl. Phys. Lett. 2002. vol. 80:1667.
Blankenburg et al., Reel-to-reel wet coating as an efficient up-scaling technique for the production of bulk-heterojunction polymer solar cells. Sol. Energy Mater. Sol. Cells. 2009. vol. 93:476-483.
Jong So Kim et.al., Control of the electrode work function and active layer morphology via surgace modification of indium tin oxide for high efficiency organic photovoltaics. Appl. Phys. Lett. 2007. vol. 91:112111.
Jung and Jo. Annealing-free high efficiency and large area polymer solar cells fabricated by a roller painting process. Adv. Func. Mater. 2010. vol. 20:1-9.
Krebs and Norrman, Using light-induced thermocleavage in a roll-to-roll process for polymer solar cells, ACS Appl. Mater. Interfaces. 2010. vol. 2 (No. 3):877-887.
Krebs et al., A roll-to-roll process to flexible polymer solar cells: model studies, manufacture and operational stability studies. J. Mater. Chem. 2009. vol. 19:5442-5451.
Krebs et al., Large area plastic solar cell modules, Mater. Sci. Eng. B. 2007. vol. 138:106-111.
Lim et al., Spray-deposited poly(3,4-ethylenedioxythiophene):poly(styrenesulfonate) top electrode for organic solar cells, Appl. Phys. Lett. 2008. vol. 93:193301-193304.
Lungenschmied et al., Flexible, long-lived, large-area, organic solar cells, Sol. Energy Mater. Sol. Cells. 2007. vol. 91:379-384.
Martin A. Green et al., Solar Cell Efficiency Tables (Version 36). Prog. Photovolt: Res. Appl. 2010. vol. 18:346-352.
Niggemann et al., Organic solar cell modules for specific applications—from energy autonomous systems to large area photovoltaics. Thin Solid Films. 2008. vol. 516:7181-7187.
P. Peumans et al., Efficient photon hervesting at high optical intensities in ultrathin organic double-heterostructure photovoltaic diodes. Appl. Phys. Lett. 2000. vol. 76:2650-2652.
S.I. Na et al., Fully spray-coated ITO free organic solar cells for 1w-cost power generation. Solar Energy Materials and Solar Cells. Aug. 2010. vol. 94 (Issue 8):1333-1337.
Steim et al., Flexible polymer Photovoltaic modules with incorporated organic bypass diodes to address module shading effects. Sol. Energy Mater. Sol. Cells. 2009. vol. 93:1963-1967.
Tipnis et al., Large-area organic photovoltaic module—fabrication and performance, Sol. Energy Mater. Sol. Cells. 2009. vol. 93:442-446.
Weickert et al., Spray-deposited PEDOT:PSS for inverted organic solar cells, Sol. Energy Mater. Sol. Cells. 2010. vol. 94:2371-2374.
Yu et al., Efficient inverted solar cells using TiO2 nanotube arrays, Nanotechnology. 2008. vol. 19:255202-255207.
G. Yu, et al., Polymer Photovoltaic Cells: Enhanced Efficiencies via a Network of Internal Donor-Acceptor Heterojunctions. Science 1995, vol. 270, No. 5243, pp. 1789-1791.
Shaheen et al., 2.5% efficient organic plastic solar cells, Appl. Phys. Lett. 2001. vol. 78:841-843.
W. Ma et al., Thermally Stable, Efficient Polymer Solar Cells with Nanoscale Control of the Interpenetrating Network Morphology. Adv. Funct. Mater. 2005, vol. 15, pp. 1617-1622.
Reyes-Reyes, et al., High-efficiency photovoltaic devices based on annealed poly(3-hexylthiophene) and 1-(3-methoxycarbonyl)-propyl-1-phenyl-(6,6)C61 blends. Appl. Phys. Lett. 2005, 87, 083506-9.
P. Peumans and S. R. Forrest, Very-high-efficiency double-heterostructure copper phthalocyanine/C60 photovoltaic cells. Appl. Phys. Lett. 2001. vol. 79:126.
Zimmermann et al., ITO-free wrap through organic solar cells—a module concept for cost-efficient reel-to-reel production, Sol. Energy Mater. Sol. Cells. 2007. vol. 91:374-378.
Huang et al., A Semi-transparent plastic solar cell fabricated by a lamination process, Adv. Mater. 2008. vol. 20:415-419.
Li et al., Efficient inverted polymer solar cells, Appl. Phys. Lett. 2006. vol. 88:253503-253506.
Zou et al., Metal grid/conducting polymer hybrid transparent electrode for inverted polymer solar cells, Appl. Phys. Lett. 2010. vol. 96:203301-203304.
Waldauf et al., High efficient inverted organic photovoltaics using solution based titanium oxide as electron selective contact. Appl. Phys. Lett. 2006. vol. 89:233517-233520.
Zhou et al., Inverted and transparent polymer solar cells prepared with vacuum-free processing, Sol. Eng. Sol. Cells. 2009. vol. 93:497-500.
Lewis, et al., Fabrication of organic solar array for applications in microelectromechanical systems. Journal of Renewable and Sustainable Energy 2009, 1, 013101-9.
Kline and McGehee, Morphology and charge transport in conjugated polymers, J Macromol. Sci. C: Polym. Rev. 2006. vol. 46:27-45.
Geiser et al., Poly(3-hexylthiophene)/C60 heterojunction solar cells: implication of morphology on performance and ambipolar charge collection, Sol. Eng. Sol. Cells. 2008. vol. 92:464-473.
Graupner et al., Shallow and deep traps in conjugated polymers of high intrachain order, Phys. Rev. B. 1996. vol. 54 (No. 11):7610-7613.
Nelson, Organic photovoltaic films. Current Opinion in Solid State and Materials Science 2002, vol. 6(1), 87-95.
Dennler et al., A new encapsulation solution for flexible organic solar cells, Thin Solid Films. 2006. vol. 511-512:349-353.
N. S. Sariciftci, et al., Photoinduced Electron Transfer from a Conducting Polymer to Buckminsterfullerene. Science 1992, vol. 258, No. 5087, pp. 1474-1476.
C. Y. Yang, et al., Morphology of composites of semiconducting polymers mixed with C6O. Synth. Met. 1996, vol. 83, pp. 85-88.
Padinger, et al., Effects of Postproduction Treatment on Plastic Solar Cells. Adv. Funct. Mater. 2003, 13(1), pp. 85-88.
C. J. Brabec, et al., Effect of LiF/metal electrodes on the performance of plastic solar cells. Appl. Phys. Lett. 2002, vol. 80, No. 7, pp. 1288-1290.
Chen, et al., Polymer solar cells with enhanced open-circuit voltage and efficiency. Nat. Photonics, 2009, 3(11), pp. 649-653.
Kim et al., Performance optimization of polymer solar cells using electrostatically sprayed photoactive layers, Adv. Funct. Mater. 2010. vol. 20:3538-3546.
Kim et al., Substrate heated spray-deposition method for high efficient organic solar cell: morphology inspection, Jap. J. Appl. Phys. 2010. vol. 49:018002-1-018002-2.

(56) References Cited

OTHER PUBLICATIONS

Krebs, All solution roll-to-roll processed polymer solar cells free from indium-tin-oxide and vacuum coating steps, Org. Electron. 2009. vol. 10:761-768.

Manceau et al., ITO-free flexible polymer solar cells: from small model devices to roll-to-roll processed large modules, Org. Electron. 2011. vol. 12:566-574.

Van Der Pauw, A method of measuring the resistivity and Hall coefficient on lamellae of arbitrary shape, Philips Tech. Rev. 1958. vol. 20:220-224.

Van Zant, Microchip Fabrication: A Practical Guide to Semiconductor Processing, McGraw-Hill. 2000. 4th Edition. Chapter 14. pp. 431-432.

International Search Report for PCT/US2012/023491 (filing date of Feb. 1, 2012) with a mailing date of Sep. 27, 2012; Applicant: University of South Florida et al.

Preliminary Search for Patentability for PCT/US2012/023491 (filing date of Feb. 1, 2013) with a priority date of Feb. 1, 2011; Applicant: University of South Florida et al.

International Search Report and Written Opinion for PCT/US2011/054290, with a mailing date of May 4, 2012.

International Preliminary Report on Patentability for PCT/US2011/054290, with a mailing date of Apr. 11, 2013.

International Search Report and Written Opinion for PCT/US2012/025028, with a mailing date of Sep. 28, 2012.

Lewis, et al., Metal-free organic solar cell using self assembled monolayer. American Physical Society 2011 meeting poster, Mar. 21-25, 2011.

Girotto, et al., High-Performance Organic Solar Cells with Spray-Coated Hole-Transport and Active Layers. Adv. Funct. Mater. Jan. 7, 2011;21(1):64-72, online Nov. 9, 2010.

Lewis, et al., Metal-free Organic Solar Cell Using Self Assembled Monolayer. Am Phys Soc. Dallas, TX, Mar. 21-25, 2011.

Kim, Gi-Hwan et al. The effect of introducing a buffer layer to polymer solar cells on cell efficiency. Solar Energy Materials and Solar Cells, Elsevier Science Publishers, Amsterdam, NL, vol. 95, No. 4, Dec. 8, 2010, pp. 1119-1122, XP028148521, ISSN: 0927-0248, DOI: 10.1016/J.SOLMAT.201 0.12.026.

Haines, Alex. W. et al. Anode Interfacial Tuning via Electron-Blocking/Hole-Transport Layers and Indium Tin Oxide Surface Treatment in Bulk-Heterojunction Organic Photovoltaic Cells. Advanced Functional Materials, Wiley-VCH Verlag GMBH & Co. KGAA, DE, vol. 20, No. 4, Feb. 22, 2010, pp. 595-606, XP001551920, ISSN 1616-301X, DOI: 10.1002/ADFM.200901045.

Chen, Fang-Chung et al. Light harvesting schemes for high-performance polymer solar cells. Advances in Optoelectronics and Micro/Nano-Optics (AOM). 2010 PSA-IEEE-COS, IEEE, Dec. 3, 2010, pp. 1-4, XP031914498, DOI: 10.11 09/AOM.201 0.5713603, ISBN: 978-1-4244-8393-8.

Examination Search Report issued by the Canadian Intellectual Property Office on May 19, 2015 for corresponding Canadian Patent Application No. 2,819,899.

* cited by examiner

US 9,401,437 B2

PARTIALLY-SPRAYED LAYER ORGANIC SOLAR PHOTOVOLTAIC CELL USING A SELF-ASSEMBLED MONOLAYER AND METHOD OF MANUFACTURE

CROSS REFERENCE TO RELATED APPLICATIONS

This application is a continuation of prior filed International Application, Serial Number PCT/US2012/23491 filed Feb. 1, 2012, which claims priority to U.S. Provisional Patent Application 61/438,488, entitled, "Partially-Sprayed Layer Organic Solar Photovoltaic Cell using a Self-Assembled Molecule Layer and Method of Manufacture", filed 1 Feb. 2011, the contents of which are herein incorporated by reference.

FIELD OF INVENTION

This invention relates to spray-manufactured organic solar photovoltaic cell. Specifically, the invention provides a novel method of manufacturing organic solar photovoltaic cells using spray-deposition and the organic solar photovoltaic cell resulting therefrom.

BACKGROUND OF THE INVENTION

In recent years, energy consumption has drastically increased, due in part to increased industrial development throughout the world. The increased energy consumption has strained natural resources, such as fossil fuels, as well as global capacity to handle the byproducts of consuming these resources. Moreover, future demands for energy are expected in greatly increase, as populations increase and developing nations demand more energy. These factors necessitate the development of new and clean energy sources that are economical, efficient, and have minimal impact on the global environment.

Photovoltaic cells have been used since the 1970s as an alternative to traditional energy sources. Because photovoltaic cells use existing energy from sunlight, the environmental impact from photovoltaic energy generation is significantly less than traditional energy generation. Most of the commercialized photovoltaic cells are inorganic solar cells using single crystal silicon, polycrystal silicon or amorphous silicon. Traditionally, solar modules made from silicon are installed on rooftops of buildings. However, these inorganic silicon-based photovoltaic cells are produced in complicated processes and at high costs, limiting the use of photovoltaic cells. These silicon wafer-based cells are brittle, opaque substances that limit their use, such as on window technology where transparency is a key issue. Further, installation is an issue since these solar modules are heavy and brittle. In addition, installation locations, such as rooftops, are limited compared to the window area in normal buildings, and even less in skyscrapers. To solve such drawbacks, photovoltaics cell using organic materials have been actively researched.

The photovoltaic process in OPV first starts from the absorption of light mainly by the polymer, followed by the formation of excitons. The exciton then migrates to and dissociates at the interface of donor (polymer)/acceptor (fullerene). Separated electrons and holes travel to opposite electrodes via hopping, and are collected at the electrodes, resulting in an open circuit voltage (Voc). Upon connection of electrodes, a photocurrent (short circuit current, Isc) is created.

Organic photovoltaic cells based on $\pi$-conjugated polymers have been intensively studied following the discovery of fast charge transfer between polymer and carbon $C_{60}$. Conventional organic photovoltaic devices use transparent substrates, such as an indium oxide like indium tin oxide (ITO) or IZO, as an anode and aluminum or other metal as a cathode. A photoactive material including an electron donor material and an electron acceptor material is sandwiched between the anode and the cathode. The donor material in conventional devices is poly-3-hexylthiophene (P3HT), which is a conjugated polymer. The conventional acceptor material is (6,6)-phenyl $C_{61}$ butyric acid methylester (PCBM), which is a fullerene derivative. Both the ITO and aluminum contacts use sputtering and thermal vapor deposition, both of which are expensive, high vacuum, technologies. In these photovoltaic cells, light is typically incident on a side of the substrate requiring a transparent substrate and a transparent electrode. However, this limits the materials that may be selected for the substrate and electrode. Further, a minimum thickness of 30 to 500 nm is needed to increasing conductivity. Moreover, the organic photoelectric conversion layer is sensitive to oxygen and moisture, which reduce the power conversion efficiency and the life cycle of the organic solar cell. Development of organic photovoltaic cells, has achieved a conversion efficiency of 5.2% (Martin A. Green et. al., Prog. Photovolt: Res. Appl. 2010; 18:346-352).

These polymeric OPV holds promise for potential cost-effective photovoltaics since it is solution processable. Large area OPVs have been demonstrated using printing (Krebs and Norman, Using light-induced thermocleavage in a roll-to-roll process for polymer solar cells, ACS Appl. Mater. Interfaces 2 (2010) 877-887; Krebs, et al., A roll-to-roll process to flexible polymer solar cells: model studies, manufacture and operational stability studies, J. Mater. Chem. 19 (2009) 5442-5451; Krebs, et al., Large area plastic solar cell modules, Mater. Sci. Eng. B 138 (2007) 106-111; Steim, et al., Flexible polymer Photovoltaic modules with incorporated organic bypass diodes to address module shading effects, Sol. Energy Mater. Sol. Cells 93 (2009) 1963-1967; Blankenburg, et al., Reel to reel wet coating as an efficient up-scaling technique for the production of bulk heterojunction polymer solar cells, Sol. Energy Mater. Sol. Cells 93 (2009) 476-483), spin-coating and laser scribing (Niggemann, et al., Organic solar cell modules for specific applications—from energy autonomous systems to large area photovoltaics, Thin Solid Films 516 (2008) 7181-7187; Tipnis, et al., Large-area organic photovoltaic module—fabrication and performance, Sol. Energy Mater. Sol. Cells 93 (2009) 442-446; Lungenschmied, et al., Flexible, long-lived, large-area, organic solar cells, Sol. Energy Mater. Sol. Cells 91 (2007) 379-384), and roller painting (Jung and Jo, Annealing-free high efficiency and large area polymer solar cells fabricated by a roller painting process, Adv. Func. Mater. 20 (2010) 2355-2363). ITO, a transparent conductor, is commonly used as hole collecting electrode (anode) in OPV, and a normal geometry OPV starts from ITO anode, with the electron accepting electrode (cathode) usually a low work function metal such as aluminum or calcium, being added via thermal evaporation process.

In addition, to improve efficiency of the organic thin film solar cell, photoactive layers were developed using a low-molecular weight organic material, with the layers stacked and functions separated by layer. (P. Peumans, V. Bulovic and S. R. Forrest, Appl. Phys. Lett. 76, 2650 (2000)). Alternatively, the photoactive layers were stacked with a metal layer of about 0.5 to 5 nm interposed to double the open end voltage ($V_{oc}$). (A. Yakimov and S. R. Forrest, Appl. Phys. Lett. 80, 1667 (2002)). As described above, stacking of photoactive layer is one of the most effective techniques for improving efficiency of the organic thin film solar cell. However, stacking photoactive layers can cause layers to melt due to solvent formation from the different layers. Stacking also limits the transparency of the photovoltaic. Interposing a metal layer between the photoactive layers can prevent solvent from one photoactive layer from penetrating into another photoactive layer and preventing damage to the other photoactive layer. However, the metal layer also reduces light transmittance, affecting power conversion efficiency of the photovoltaic cell.

However, in order for solar cells to be compatible with windows, issues with the transparency of the photovoltaic must first be addressed. The metal contacts used in traditional solar modules are visibility-blocking and has to be replaced. Another challenge is to reduce cost for large scale manufacturing in order for organic solar cells to be commercially viable, a much lower manufacturing cost to compensate for the lower efficiency than current photovoltaic products. For example, a solution-based all-spray device, which was opaque, showed a PCE as high as 0.42% (Lim, et al., Spray-deposited poly(3,4-ethylenedioxythiophene):poly(styrenesulfonate) top electrode for organic solar cells, Appl. Phys. Lett. 93 (2008) 193301-193304). Large-scale manufacturing techniques, such as printing, have lowered the cost of manufacture, but still involve the use of metal in certain way, and therefore affect the transparency of the photovoltaic cell.

Therefore, what is needed is a new method of manufacturing organic photovoltaic cells without the use of metal, to allow for novel photovoltaic cells with enhanced transparency. The art at the time the present invention was made did not describe how to attain these goals, of manufacturing less expensive and less complex devices, having enhanced transparency.

SUMMARY OF THE INVENTION

An organic solar photovoltaic cell is disclosed which utilizes a Self Assembly Molecule as an interfacial layer of the cell. The Photovoltaic cell comprises a substrate having a first face and a second face. The substrate may be any material known in the art for use as a photovoltaic substrate. Exemplary materials include cloth, such as nylon cloth, cotton cloth, polyester cloth, hemp cloth, bamboo cloth, glass, such as a low alkaline earth boro-aluminosilicate glass, and plastic. Useful glass is known in the art, and may include glass having a nominal sheet resistance of 4-10 Ohm/square. The substrate may be glass dimensioned into 4"×4" substrates. Exemplary plastics include any polymer such as acrylonitrile butadiene styrene (ABS), acrylic (PMMA), cyclic olefin copolymer (COC), ethylene-vinyl acetate (EVA), ethylene vinyl alcohol (EVOH), fluoroplastics, such as PTFE, FEP, PFA, CTFE, ECTFE, and ETFE, Kydex (an acrylic/PVC alloy), liquid crystal polymer (LCP), polyoxymethylene (POM or Acetal), polyacrylates (acrylic), polyacrylonitrile (PAN or acrylonitrile), polyamide (PA or nylon), polyamide-imide (PAI), polyaryletherketone (PAEK or ketone), polybutadiene (PBD), polybutylene (PB), polychlorotrifluoroethylene (PCTFE), polycyclohexylene dimethylene terephthalate (PCT), polycarbonate (PC), polyhydroxyalkanoates (PHAs), polyketone (PK), polyester, polyetherketoneketone (PEKK), polyetherimide (PEI), polyethersulfone (PES), chlorinated polyethylene (CPE), polyimide (PI), polymethylpentene (PMP), polyphenylene oxide (PPO), polyphenylene sulfide (PPS), polypropylene (PP), polystyrene (PS), polysulfone (PSU), polytrimethylene terephthalate (PTT), polyurethane (PU), polyvinyl acetate (PVA), styrene-acrylonitrile (SAN).

An ITO layer is patterned onto the first face of the glass, forming an anode. The Self-Assembled Monolayer (SAM), such as N-propyl trimethoxysilane or aminopropyl triethoxysilane, are patterned onto the ITO as a layer having a monolayer of molecules of about 2 nm or less, such as 2 nm. However, it is important that the thickness of SAM layer not be more than 2-3 layers of single molecules, i.e. having a thickness of 10 nm or less. The SAM layer is covered by an active layer of P3HT and PCBM. The the active layer of has a layer thickness of about 130 nm to about 200 nm, such as about 130 nm or about 200 nm. A layer comprising poly(3,4)ethylenedioxythiophene:poly-styrenesulfonate and 5 vol. % of dimethylsulfoxide is disposed on the active layer, providing the anode for the photovoltaic cell with inverted structure. Optionally, this anode layer has a thickness of about 100 nm to about 700 nm, and may be 600 nm in some variations. Exemplary thicknesses include 200 nm, 250 nm, 300 nm, 350 nm, 400 nm, 450 nm, 550 nm, 600 nm, 650 nm, and 700 nm.

The cell is sealed using a sealant such as a UV-cured epoxy encapsulant disposed on the edges of the substrate.

The photovoltaic cells may also be in electrical connection, thereby forming an array. For example, a series of organic solar photovoltaic cells disposed into an array of 50 individual cells having active area of 12 $mm^2$. The array comprises 10 cells disposed in series in one row, and 5 rows in parallel connection in some variations.

A spray technique was also demonstrated to fabricate the photovoltaic cells and arrays, in conjunction with a novel Self-Assembled Monolayer of N-propyl trimethoxysilane. Compared to conventional technology based on spin-coating and using metal as cathode contact, which greatly limits transparency of solar cells and posts difficulty for large scale manufacturing, the new spray technology solves these two problems simultaneously. A thin film organic solar module is fabricated employing this layer-by-layer spray technique onto desired substrates (can be rigid as well as flexible). This technique has great potential in large-scale, low-cost manufacturing of commercial photovoltaic products based on solutions of organic semiconductors. This technology will get rid of high-vacuum, high temperature, low rate and high-cost manufacturing associated with current silicon and in-organic thin film photovoltaic products. Furthermore, this technology could be used on any type of substrate including cloth and plastic. The method of manufacturing the organic solar photovoltaic cell comprises patterning ITO on the substrate discussed above. The ITO patterns optionally includes obtaining an ITO substrate, and patterning the ITO using photolithography. In some variations, the ITO photolithography pattern is sprayed onto the substrate using a custom made spray mask. Some of the ITO was then etched away from the substrate. In some varaitions, HCl and $HNO_3$ was used as an etchant, through any etchant known in the art appropriate for the ITO and substrate may be used. The etched substrate was then cleaned. Exemplary cleaning methods include sonification in trichloroethylene, acetone, and/or isopropanol. The substrate is optionally cleaned at 50° C. for 20 min for each of three baths, trichloroethylene, acetone, and isopropanol, followed by drying with $N_2$.

A Self Assembled Molecule layer, such as a layer of N-propyl trimethoxysilane or other self assembled molecule material known in the art like aminopropyl triethoxysilane ($NH_2$) (Jong Soo Kim et. al., Appl. Phys. Lett. 91, 112111 (2007)), is applied onto the etched ITO glass. The Self-Assembled monolayer is annealed inside a glovebox. An active later of P3HT and PCBM was formed by means and concentrations known in the art. An exemplary solution is prepared my mixing P3HT and PCBM with a weight ratio of 1:1 in dichlorobenzene. This solution is optionally stirred on a hotplate for 48 h at 60° C. After preparation, the active layer was sprayed onto the Self Assembled Molecule layer. The the partially-assembled device dried in an antechamber under vacuum for at least 12 hours.

A layer comprising poly(3,4)ethylenedioxythiophene:poly-styrenesulfonate mixed with 5 vol. % of dimethylsulfoxide is formed by any means known in the art. For example, the poly(3,4)ethylenedioxythiophene:poly-styrenesulfonate was diluted and filtered through a 0.45 µm filter followed by mixing the dimethylsulfoxide into the diluted poly(3,4)ethylenedioxythiophene:poly-styrenesulfonate. The poly(3,4)ethylenedioxythiophene:poly-styrenesulfonate solution was sprayed onto the active layer and the device placed into into high vacuum, such as $10^{-6}$ Torr, for 1 h. The solar photovoltaic cell was then annealed and encapsulated with a UV-cured epoxy, which was cured with UV.

The inventive device and method has solved the costly and complicated process currently used to make crystalline and thin film solar cells, namely, high-vacuum, high temperature, low rate and high-cost manufacturing. Furthermore, this technology could be used on other type of substrate such as plastic. This new technology enables all solution processable organic solar panel on with transparent contacts. This technique has great potential in large-scale, low-cost manufacturing of commercial photovoltaic products based on solutions of organic semiconductors. The use of self-assembled monolayer (SAM) modify the work function of ITO, and SAM was used in place of the previous $Cs_2CO_3$ improving the device efficiency and reproducibility.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
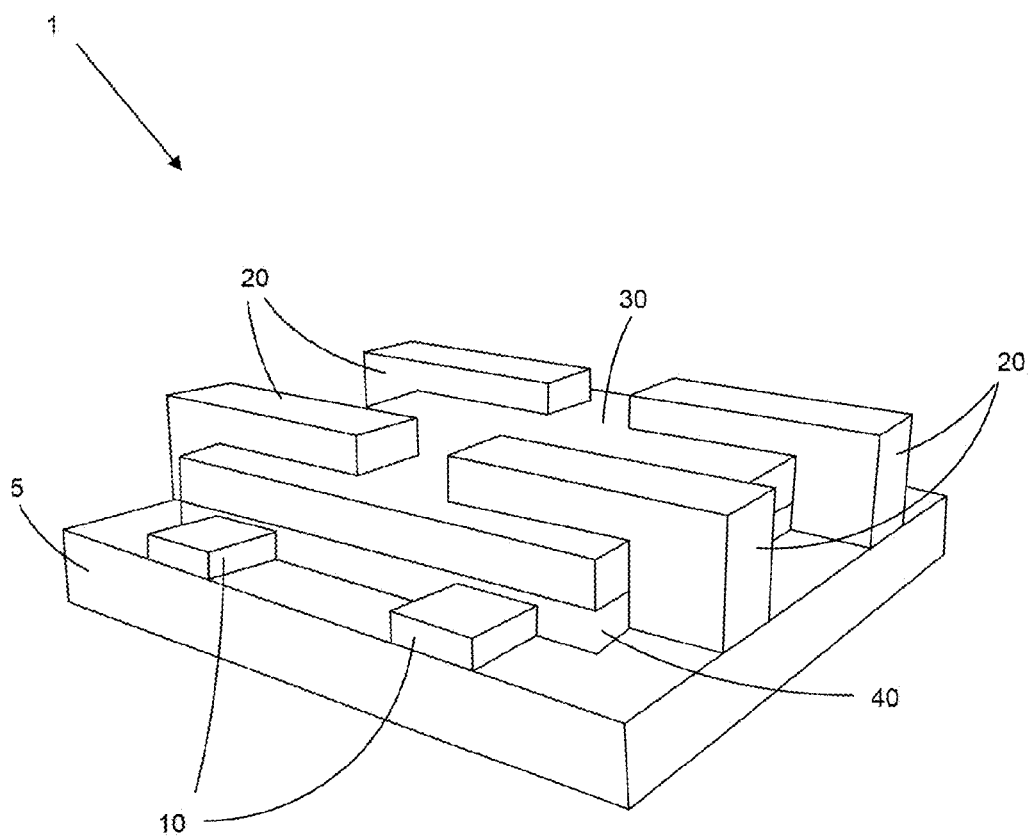
FIG. 1 is a diagram showing a perspective view of the novel inverted OPV cells containing sprayed-on layers.

The present invention for the fabricatation of a see-through organic solar array via layer-by-layer (LBL) spray may be understood more readily by reference to the following detailed description of the preferred embodiments of the invention and the Examples included herein. However, before the present compounds, compositions, and methods are disclosed and described, it is to be understood that this invention is not limited to specific compounds, specific conditions, or specific methods, etc., unless stated as such. Thus, the invention may vary, and the numerous modifications and variations therein will be apparent to those skilled in the art. It is also to be understood that the terminology used herein is for the purpose of describing specific embodiments only and is not intended to be limiting.

As used herein, "about" means approximately or nearly and in the context of a numerical value or range set forth means±15% of the numerical.

As used herein, "substantially" means largely if not wholly that which is specified but so close that the difference is insignificant.

All masks described herein for spray were custom made by Towne Technologies, Inc.

Example

The indium tin oxide (ITO) is patterned onto a glass substrate using a positive photo resist, such as Shipley 1813, spin coated at 4500 rpm and soft baked on a hotplate for 3 minutes at 90° C. The substrate is then exposed to a UV-lamp for 1.4 seconds in a constant intensity mode set to 25 watts. The structure was developed for about 2.5 minutes using Shipley MF319 and rinsed with water. The substrate was then hardbaked, at 145° C. for 4 minutes and any excess photoresist cleaned off with acetone and cotton. After cleaning, the substrate was etched from about 5-11 minutes with a solution of 20% HCl-7% $HNO_3$ on a hotplate at 100° C. The etched substrate was then cleaned by hand using acetone followed by isopropanol and UV-ozone cleaned for at least 15 minutes.

The Self-Assembled Monolayer (SAM) layer was formed on top of the patterned ITO layer. A solution of N-propyl trimethoxysilane (3 mM) in ethanol was prepared and stirred for 10 minutes at room temperature. Once the SAM solution was ready, the ITO substrate was placed in the prepared SAM solution and soaked for 36-48 hours inside an $N_2$ glovebox at room temperature. The SAM solution provides a single-layer thickness of about, or less than, 2 nm. The substrate was then rinsed with ethanol, followed by a toluene wash and an isopropanol wash, each performed for 10 minutes.

The active layer solution was prepared by mixing separate solutions of P3HT (high molecular weight) and PCBM ($C_{60}$) in dichlorobenzene at 20 mg/mL and stirred on a hotplate for 24 hours at 60° C. These two separate solutions were then mixed together at a 1:1 ratio and stirred for 24 hours at 60° C., producing a final solution of 10 mg/mL. The active coating was then spray coated onto the SAM layer using an airbrush with $N_2$ set to 30 psi. The airbrush was set at about 7-10 cm away from the substrate and multiple light layers of active layer were sprayed. For each spray, the solution used was about 600-900 µL.

A final thick continuous coat of active layer was applied onto the multiple thin layers to complete the active layer coating, forming a thickness of between about 130 nm to about 200 nm. After drying, excess active layer solution was wiped off of the substrate using dichlorobenzene (DCB)-wetted cotton followed by isopropanol-wetted cotton. The substrate was then left to dry in the antichamber, under vacuum for at least 8-12 hours.

A kovar shadow mask was aligned in position with the substrate and held in place by placing a magnet underneath the substrate. The series connection locations were wiped using a wooden dowel to expose the cathode for later electrical connection.

The modified PEDOT (m-PED) layer was prepared by adding dimethylsulfoxide at a concentration of 5% by volume to a solution of filtered PEDOT:PSS. The solution was then stirred at room temperature followed by 1 h of sonification. The m-PED coating was prepared by placing a substrate/mask on a hotplate (90° C.). The m-PED layer was spray coated using nitrogen ($N_2$) as the carrier gas, set to 30 psi, with the airbruch positioned about 7-10 cm from the substrate. Multiple light layers were applied until the final thickness of about 500 nm to about 700 nm was reached. The substrate was then removed from the hotplate and the mask removed. Care was taken to avoid removing the mPED with the mask. The substrate was placed into high vacuum treatment ($10^{-6}$ Torr) for 1 h, followed by a substrate annealing at 120-160° C. for 10 min.

The substrate was encapsulated using a silver paint applied to the device contacts, which were then allowed to dry. The encapsulation glass was notched and cleaned by hand using acetone and isopropanol, followed by UV-ozone cleaning. UV-cure epoxy encapsulant (EPO-TEK OG142-12; Epoxy Technology, Inc., Billerica, Mass.) was applied to the edge of the encapsulation glass, and the glass is placed into the glovebox for at least 15 min, with UV exposure. The device was then flipped upside down, and the epoxy applied on top of the encapsulation glass. The device was finally exposed to 15 min of UV to cure the encapsulant epoxy.

Example 2

Figure 2:
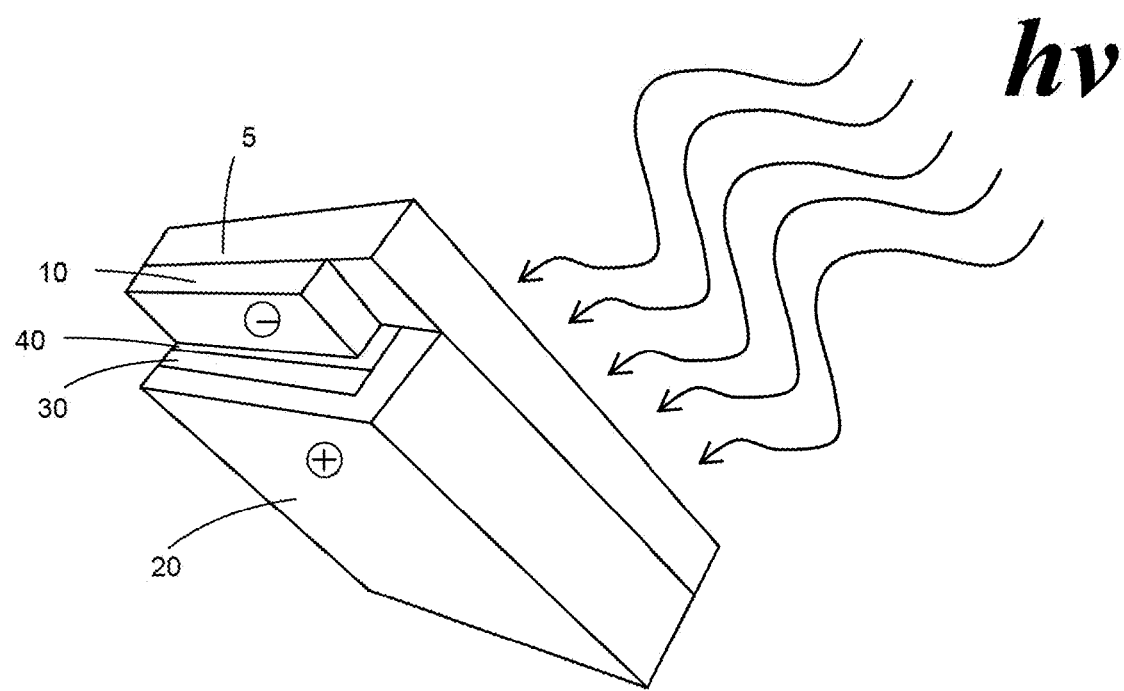
FIG. 2 is a diagram showing the novel organic photovoltaic cell as it receives photons having energy hv.

Inverted organic photovoltaic cell 1, seen dissected in FIG. 1, was created using the method described in Example 1. Inverted photovoltaic cell 1 was composed of different layers of active materials and terminals (anode and cathode) built onto substrate 5. Anode 10, comprised of ITO in the present example, was sprayed onto substrate 5 forming a '||' pattern extending from a first set of edges of substrate 5. SAM layer 40 covers anode 10, except for the outermost edges, as seen in FIG. 2. The components of the SAM layer were chosen to provide a gradient for charges crossing the interface, approximating a conventional p-n junction with organic semiconductors, thereby providing an increased efficiency of heterojunctions. Active layer 30 is disposed directly on top of interfacial buffer layer 40, and was prepared using poly(3-hexylthiophene) and 6,6-phenyl C61 butyric acid methyl ester. Anode 20 was disposed on the active layer in a pattern, similar to the cathode, but perpendicular to the cathode. Exemplary anode materials include PEDOT:PSS doped with dimethylsulfoxide. The fully encapsulated 4 µm×4 µm array was found to possess over 30% transparency.

Figure 3:
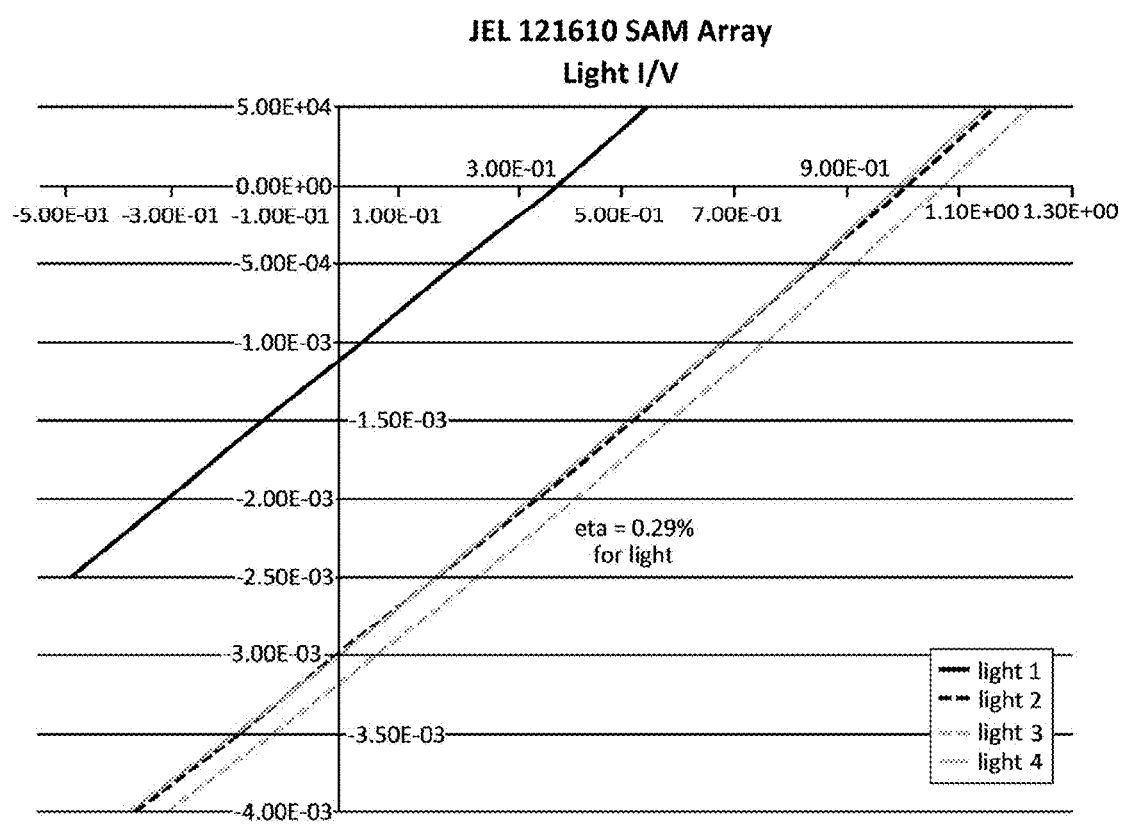
FIG. 3 is a graph showing current-voltage (I-V) of an inverted array using SAM under continuous AM1.5 solar illumination measured at different time points.

The device was analyzed by exposing the cell to continuous radiation, as seen in FIG. 2. The photovoltaic cell was exposed to continuous illumination from a Newport 1.6 KW solar simulator under AM1.5 irradiance of 100 mW/cm². Current-voltage (I-V) results from continuous AM1.5 solar illumination from the UV lamp showed that the inverted array using SAM under generated a voltage of $V_{oc}$=1.2 V, current of $I_{sc}$=3.2 mA, FF=0.23, and a power conversion efficiency (PCE) of 0.3% for the $3^{rd}$ measurement, as seen in FIG. 3.

Example 3

Solar illumination has been demonstrated to improve solar array efficiency up to 250%. Device efficiency of 1.80% was observed with the array under AM1.5 irradiance. Data have shown that the performance enhancement under illumination only happens with sprayed devices, not devices made by spin coating (See, Lewis, et al., PCT/US11/54290). This means that solar cells made using the present spray-on technique perform better under sunlight, which is beneficial for solar energy application.

Figure 4:
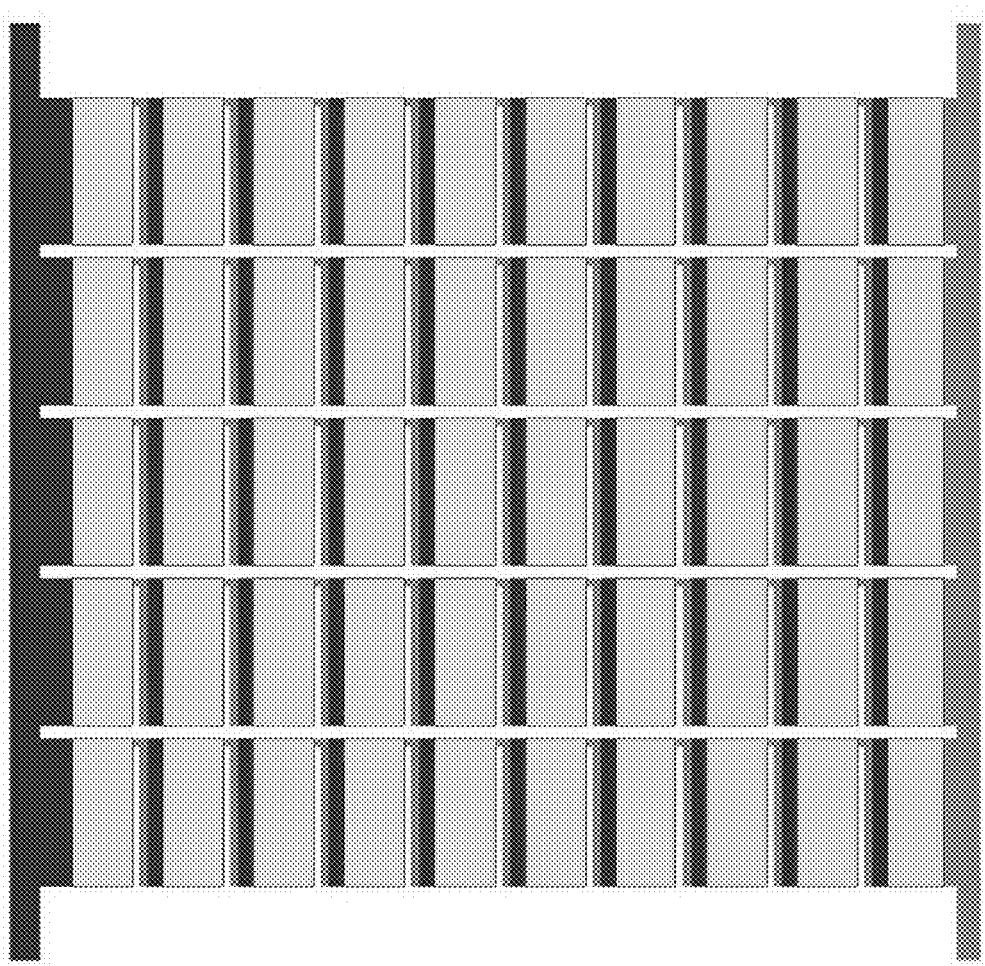
FIG. 4 is a diagram of the device architecture showing a top view of the of an inverted array.
Figure 5:
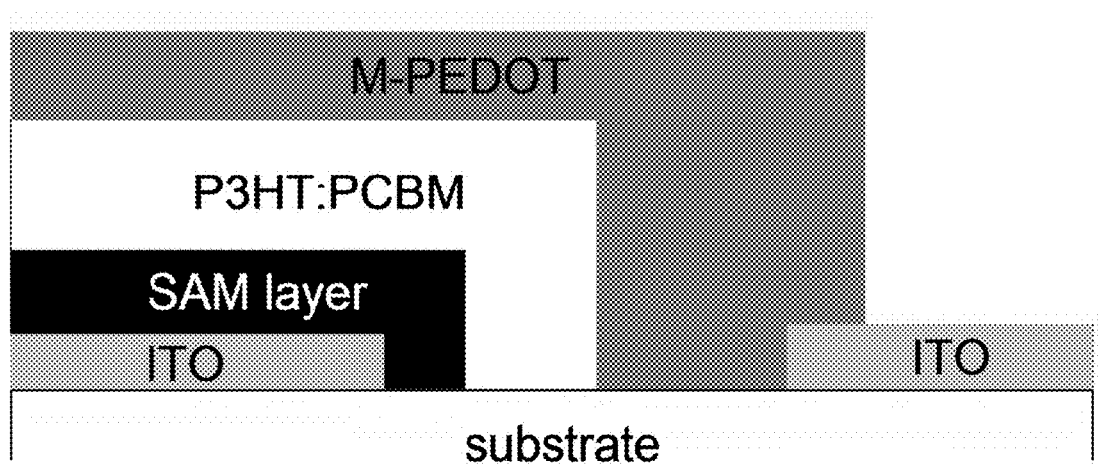
FIG. 5 is a diagram showing the cross sectional view of the device architecture of an inverted solar array showing series connection.

A solar array was prepared by forming 50 individual inverted cells as described above, each with an active area of 60 mm². The array was configured with 10 cells in series in one row to increase the voltage, and five rows in parallel connection to increase the current. The neighboring cells were connected using the organic layer configuration, seen in FIG. 4 and in cross section in FIG. 5.

In the preceding specification, all documents, acts, or information disclosed does not constitute an admission that the document, act, or information of any combination thereof was publicly available, known to the public, part of the general knowledge in the art, or was known to be relevant to solve any problem at the time of priority.

The disclosures of all publications cited above are expressly incorporated herein by reference, each in its entirety, to the same extent as if each were incorporated by reference individually.

While there has been described and illustrated specific embodiments of an organic photovoltaic cell, it will be apparent to those skilled in the art that variations and modifications are possible without deviating from the broad spirit and principle of the present invention. It is intended that all matters contained in the foregoing description or shown in the accompanying drawings shall be interpreted as illustrative and not in a limiting sense. It is also to be understood that the following claims are intended to cover all of the generic and specific features of the invention herein described, and all statements of the scope of the invention which, as a matter of language, might be said to fall therebetween.

What is claimed is:

1. An organic solar photovoltaic cell, comprising:
a substrate having a first face and a second face;
a patterned ITO layer disposed on the first face of the substrate;
a patterned, non-oxidized layer of Self Assembled Molecules disposed on the ITO layer, wherein the Self Assembled Molecules comprise N-propyl trimethoxysilane or aminopropyl triethoxysilane and wherein the layer of Self Assembled Molecules comprises no more than three single molecule layers, each single molecule layer having a thickness of less than or equal to about 2 nm such that the layer of Self Assembled Molecules has an overall thickness of less than or equal to about 6 nm;
an active sprayed-on layer of poly-3-hexylthiophene and (6,6)-phenyl $C_{61}$ butyric acid methylester disposed on the layer of Self Assembled Molecules, wherein the active layer comprises a plurality of multiple light spray layers, each light spray layer comprising between about 600 µL and 900 µL of poly-3-hexylthiophene and (6,6)-phenyl $C_{61}$ butyric acid methylester such that an overall thickness of the active layer is between about 130 nm to about 200 nm;
a sprayed-on layer comprising poly(3,4)ethylenedioxythiophene:poly-styrenesulfonate and 5 vol. % of dimethylsulfoxide disposed on the active layer, wherein the layer comprising poly(3,4)ethylenedioxythiophene:poly-styrenesulfonate and 5 vol. % of dimethylsulfoxide comprises a plurality of individual sprayed-on layers such that the final thickness of the poly(3,4)ethylenedioxythiophene:poly-styrenesulfonate and 5 vol. % of dimethylsulfoxide layer is between about 500 nm and about 700 nm, wherein the poly(3,4)ethylenedioxythiophene:poly-styrenesulfonate and 5 vol. % of dimethylsulfoxide form at least one positive contact;
silver paint disposed on the at least one positive contact; and
a UV-cured epoxy encapsulant disposed on a plurality of edges of the substrate.

2. The organic solar photovoltaic cell of claim 1, wherein the substrate is low alkaline earth boro-aluminosilicate glass, cloth, or plastic.

3. The organic solar photovoltaic cell of claim 1, wherein the substrate is nylon cloth, cotton cloth, polyester cloth, hemp cloth; or bamboo cloth.

4. The organic solar photovoltaic cell of claim 1, wherein the substrate is glass dimensioned into 4 inch by 4 inch squares.

5. The organic solar photovoltaic cell of claim 1, wherein the glass has a nominal sheet resistance of 4-10 Ohm/square.

6. The organic solar photovoltaic cell of claim 1, wherein the thickness of the layer comprising poly(3,4)ethylenedioxythiophene:poly-styrenesulfonate and 5 vol. % of dimethylsulfoxide is about 100 nm to about 600 nm.

7. The organic solar photovoltaic cell of claim 1, wherein the thickness of the active layer is 200 nm and the thickness of the layer comprising poly(3,4)ethylenedioxythiophene:poly-styrenesulfonate and 5 vol. % of dimethylsulfoxide is 600 nm.

8. An array of organic solar photovoltaic cells comprising a plurality of organic solar photovoltaic cells, each of the plurality of organic solar photovoltaic cells comprising:
  a substrate having a first face and a second face;
  a patterned ITO layer disposed on the first face of the substrate;
  a patterned, non-oxidized layer of Self Assembled Molecules disposed on the ITO layer, wherein the Self Assembled Molecules comprise N-propyl trimethoxysilane or aminopropyl triethoxysilane and wherein the layer of Self Assembled Molecules comprises no more than three single molecule layers, each single molecule layer having a thickness of less than or equal to about 2 nm such that the layer of Self Assembled Molecules has an overall thickness of less than or equal to about 6 nm;
  an active sprayed-on layer of poly-3-hexylthiophene and (6,6)-phenyl $C_{61}$ butyric acid methylester disposed on the layer of Self Assembled Molecules, wherein the active layer comprises a plurality of multiple light spray layers, each light spray layer comprising between about 600 μL and 900 μL of poly-3-hexylthiophene and (6,6)-phenyl $C_{61}$ butyric acid methylester such that an overall thickness of the active layer is between about 130 nm to about 200 nm;
  a sprayed-on layer comprising poly(3,4)ethylenedioxythiophene:poly-styrenesulfonate and 5 vol. % of dimethylsulfoxide disposed on the active layer, wherein the layer comprising poly(3,4)ethylenedioxythiophene:poly-styrenesulfonate and 5 vol. % of dimethylsulfoxide comprises a plurality of individual sprayed-on layers such that the final thickness of the poly(3,4)ethylenedioxythiophene:poly-styrenesulfonate and 5 vol. % of dimethylsulfoxide layer is between about 500 nm and about 700 nm, wherein the poly(3,4)ethylenedioxythiophene:poly-styrenesulfonate and 5 vol. % of dimethylsulfoxide form at least one positive contact,
  silver paint disposed on the at least one positive contact, and
  a UV-cured epoxy encapsulant disposed on a plurality of edges of the substrate.

9. The array of organic solar photovoltaic cells of claim 8, wherein the plurality of organic solar photovoltaic cells of the array further comprises 10 organic photovoltaic cells disposed in series in one row of organic photovoltaic cells, and 5 rows of organic photovoltaic cells, in parallel connection.

\* \* \* \* \*